United States Patent [19]

Ohashi et al.

[11] 4,039,981
[45] Aug. 2, 1977

[54] VARIABLE IMPEDANCE CIRCUIT

[75] Inventors: Shin-ichi Ohashi, Toyokawa; Akihiro Asada, Kodaira, both of Japan

[73] Assignee: Hitachi, Ltd., Japan

[21] Appl. No.: 672,676

[22] Filed: Apr. 1, 1976

[30] Foreign Application Priority Data

Apr. 4, 1975 Japan .................................. 50-40334

[51] Int. Cl.² .................... H03J 3/20; H03H 5/12; H03H 11/00
[52] U.S. Cl. ...................................... 334/14; 307/229; 307/264; 325/464; 333/80 T
[58] Field of Search ............................. 333/80 R, 80 T; 307/264, 229; 334/11, 14; 325/452, 464

[56] References Cited
U.S. PATENT DOCUMENTS 3,539,826 11/1970 Crouse ........................... 333/80 T X

*Primary Examiner*—Paul L. Gensler
*Attorney, Agent, or Firm*—Craig & Antonelli

[57] ABSTRACT

A variable impedance circuit comprises an amplifier with a high input impedance and a high output impedance whose gain is variable in response to a control voltage, an emitter-follower transistor, and an impedance element adapted to feedback an output signal to an input terminal of the amplifier. The input terminal of the amplifier and the input terminal of the emitter-follower transistor are connected in common. The emitter-follower transistor has its output terminal connected in series with the output terminal of the amplifier through a load resistor. An impedance of the amplifier as viewed from its input terminal is multiplied by Miller effect and varied in value by the control signal to a great extent.

10 Claims, 7 Drawing Figures

VARIABLE IMPEDANCE CIRCUIT

FIELD OF THE INVENTION

This invention relates to a circuit whose impedance is varied in response to a control signal. More particularly, this invention is concerned with a variable impedance circuit suitable for use with tuning circuits, frequency variable filter circuits, variable attenuators, noise reduction circuits for tape recorders and the like proposed by Dolby Laboratories Inc. in the United States, and demodulator circuits for CD-4 system four-channel record players.

DESCRIPTION OF THE PRIOR ART

Figure 1:
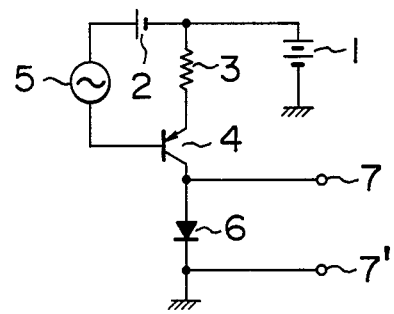
FIG. 1 is a circuit diagram of a prior art variable resistor circuit using a diode.

A variable resistor circuit in which the bias voltage to a diode or a field effect transistor is controlled to vary the internal resistance thereof has conventionally been proposed. FIG. 1 shows a basic circuit for controlling the internal resistance of a diode. The D.C. bias to a transistor 4 is set in accordance with the magnitudes of voltages of power sources 1 and 2 and the magnitude in resistance of a resistor 3. A collector current of the transistor 4 flows through a diode 6. The collector current of the transistor 4 is varied with the voltage of a control voltage source 5 and hence the current through the diode 6 is also varied. Therefore, it is possible to vary the magnitude of internal resistance of the diode 6 as viewed from terminals 7 and 7' by changes in the voltage of the control voltage source 5.

Figure 2:
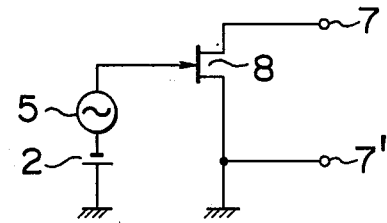
FIG. 2 is a circuit diagram of a prior art variable resistor circuit using a field effect transistor.

FIG. 2 shows a basic circuit which uses a field effect transistor. In the figure, elements having the same function as those of FIG. 1 are designated by the same reference numerals. The drain-source internal resistance of a field effect transistor 8, the operating point of which is set by the D.C. source 2, is controlled by the voltage of the control voltage source 5.

Both the diode 6 in FIG. 1 and the field effect transistor 8 in FIG. 2 have the internal resistance of a conspicuous non-linear characteristic, and thus an application of a large voltage across the terminals 7 and 7' is prevented. A countermeasure effective to compensate for the non-linear characteristic has not been developed.

As will be described below by way of examples, circuits utilizing variation in capacitance or inductance have also been proposed. In an example of variable capacitance circuits, a variable capacitance diode with a semiconductor P-N junction is controlled of its capacitance by a bias voltage. In an example of variable inductance circuits, on the other hand, permeability of a magnetic material wound with a coil is varying the D.C. magnetic flux density through the magnetic material so that inductance of the coil is controlled. (Varying the resonance frequency of a resonant circuit provided with such a coil in this manner is called mu-tuning.) Any of these circuits, however, have a short coming such that distortions (harmonic waves) due to nonlinear characteristics are generated.

Figure 3:
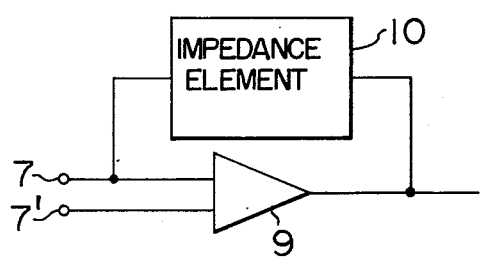
FIG. 3 is a circuit diagram for explaining Miller effect.

It will be noticed to employ a countermeasure for eliminating the distortions created in these prior art circuits, which utilizes a circuit of FIG. 3 based on the well-known Miller effect. Miller effect is such that when impedance of an impedance element 10 connected between an input and an output of an amplifier 9 as shown in FIG. 3 is $Z_1$ and the voltage gain of the amplifier 9 is G, an equivalent impedance $Z_{in}$ as viewed from input terminals 7 and 7' of the amplifier is given by equation (1), $$Z_{in} = Z_1/(1-G) \qquad (1),$$

where the input impedance of the amplifier 9 is neglected as assumed to be far larger than $Z_1/(1-G)$ and the output impedance is assumed to be sufficiently low. Accordingly, since $Z_1/(1-G)$ is varied by controlling the voltage gain G, variable impedance characteristics can be obtained. Even the circuit shown in FIG. 3, however, has difficulties in practical use as described below. Namely, in order to obtain a wide variable range, it is necessary to make the voltage gain far larger than 1 and for this, it is necessary to make the maximum undistorted output of the amplifier larger than G times the input signal applied across the terminals 7 and 7'. In the circuit of FIG. 2, for example, the input signal voltage applicable between the terminals 7 and 7' is limited to about 100 mV at the most. Further, in view of the fact that the internal resistance variation range of the field effect transistor 8 can be determined with a maximum to minimum internal resistance ratio of about 100, it is necessary to make the maximum value of the voltage gain G more than 100 for obtaining a performance comparable to that of FIG. 2 by using the circuit of FIG. 3. Therefore, the amplifier 9 is required to have the maximum output voltage of more than 10 volts. In addition, to improve the allowable input and the distortion factor in the circuit of FIGS. 3, the amplifier 9 is needed to have the maximum undistorted output of about 100 volts and hence it is difficult to realize the circuit of FIG. 3 for economical reasons.

SUMMARY OF THE INVENTION

An object of this invention is to provide a variable impedance circuit of broadening the maximum undistorted output range by utilizing Miller effect.

According to this invention, the above object can be accomplished by providing a circuit arrangement which may operate so as to omit 1 of the denominator of equation (1) to express the equivalent impedance $Z_{in}$ by the following equation (2), $$Z_{in} = Z_1/-G \qquad (2).$$

In accordance with equation (2), the equivalent impedance $Z_{in}$ can be varied from infinity to $Z_1$ by varying the gain $-G$ from zero to one (1).

Essentially, a variable impedance circuit according to this invention comprises an amplifier with a sufficiently large output impedance i.e., with an output side in the form of a constant current source, an impedance converter circuit such as an emitter-follower circuit delivering an output without changing the magnitude of an input, the input terminal of the impedance converter circuit being connected to an output terminal of the amplifier, a lead connected in series with outputs of the amplifier and the impedance converter circuit, and an impedance element adapted to feedback the output signal to the input terminal of the amplifier.

DESCRIPTION OF THE PREFERRED EMBODIMENTS

Figure 4:
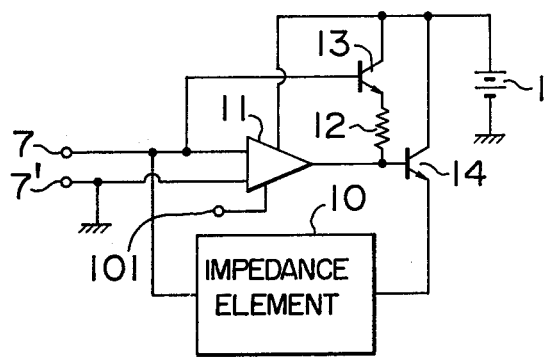
FIG. 4 is a circuit diagram for explaining the principle on which this invention is based.

Referring to FIG. 4 which shows a basic circuit useful to explain the principle of the invention, the invention will be detailed hereunder. Elements have the same function as those of the preceding figures are designated by the same reference numerals. As shown in FIG. 4, an amplifier 11 is provided with a terminal 101 to which a control signal is applied for controlling the gain of the amplifier 11. The amplifier 9 of FIG. 3 is required to have a sufficiently low output impedance whereas the amplifier 11 according to the invention is designed to have a far larger output impedance than a resistance of a resistor 12 connected to the amplifier 11 to act as a load. This high output impedance amplifier may be constituted, for example, by a circuit in which an output is delivered from the collector of a transistor. The other end of the resistor 12 connected to the amplifier 11 is connected to the emitter of an emitter-follower transistor 13. The base electrode of the transistor 13 is connected to an input terminal 7 and the transistor 13 receives an input signal applied between terminals 7 and 7' to deliver an output through a low output impedance. Therefore, the emitter voltage of the transistor 13 is maintained at the same voltage as the input signal. The output of the amplifier 11 is also connected to the base of an emitter-follower transistor 14. Between the emitter of the transistor 14 and the input terminal 7 is connected an impedance element 10. In case where the voltage of the input signal is $e_i$, the mutual conductance of the amplifier 11 is gm and the resistance of the resistor 12 is R, a voltage $e_o$ appearing at the emitter of the transistor 14 is expressed by the following equation (3), $$e_o = e_i(1 + gm \cdot R) \quad (3)$$

If the impedance of the impedance element 10 is $Z_1$, a voltage $v_z$ across the impedance element 10 is given by;

$$v_z = e_i - e_o$$

$$v_z = e_i gm \cdot R \quad (4)$$

A current $i_z$ through the impedance element 10 is equal to a quotient between the voltage $v_z$ across the impedance element 10 and the impedance $Z_1$, being given by;

$$i_z = \frac{v_z}{Z_1} \quad (5)$$

$$= \frac{e_i \cdot gm \cdot R}{Z_1}$$

$$= \frac{e_i}{Z_1/gmR}$$

Accordingly, an equivalent impedance $Z_{in}$ as viewed from the terminals 7 and 7' is, $$Z_{in} = \frac{e_i}{i_z} \quad (6)$$

$$= \frac{Z_1}{gmR}$$

It will be seen that equation (6) is identical with equation (2) when $-G$ is substituted for $gmR$. In conclusion, according to the circuit shown in FIG. 4, the equivalent impedance $Z_{in}$ can be varied to a great extent by varying the gain of the amplifier 11.

Figure 5:
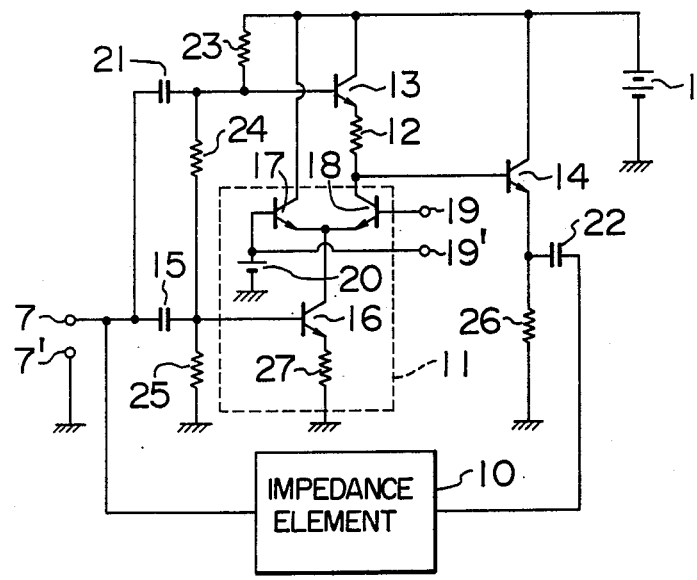
FIG. 5 is a circuit diagram of a specific variable impedance circuit embodying this invention.

The basic circuit of FIG. 4 is reduced into practice with a specific circuit as shown in FIG. 5. In the figure, like elements are designated at like reference numerals. An input signal is transmitted through a capacitor 15 to a transistor 16 and amplified therein. A current flowing through the collector of the transistor 16 branches to transistors 17 and 18, and generates a voltage across the resistor 12. The shunting ratio of the collector current is controlled by a control voltage applied between terminals 19 and 19'. A power source 20 is adapted to apply a D.C. bias to bases of the transistors 17 and 18. Thus, a circuit network including transistors 16, 17 and 18 (encircled by dotted lines) corresponds to the variable mutual conductance circuit i.e., the amplifier 11 of FIG. 4. Numerals 21 and 22 designate coupling capacitors, 23 to 26 resistors for previding D.C. biases, and 27 a resistor for setting a maximum value of gm.

Figure 6:
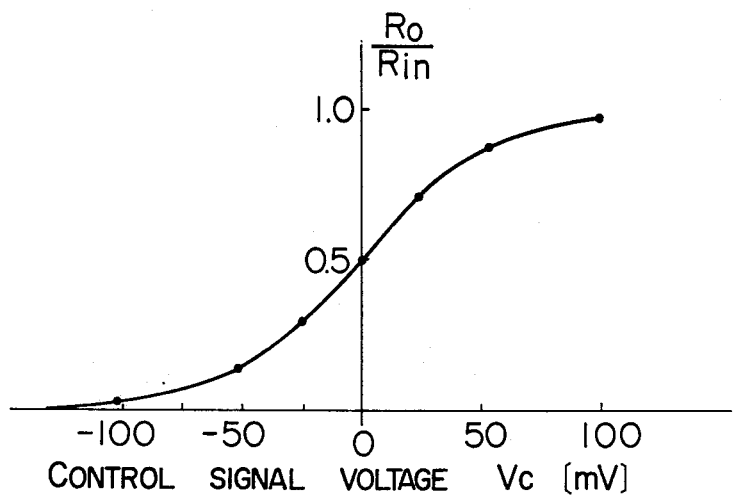
FIG. 6 is a graphical representation showing one example of measurement results indicative of variations in the input resistance in relation to control voltages $V_c$ obtained with the circuit of FIG. 5.

There is shown in FIG. 6 experimental results showing those variations in the ratio of the resistance $R_o$ of the impedance element 10 to the resistance $R_{in}$ viewed from the terminals 7 and 7' which are measured in relation to a control voltage $V_c$ between the terminals 19 and 19' when the resistances of resistors 12 and 27 in FIG. 5 are set to an equal value and the impedance element 10 is a resistor having the resistance $R_o$. Since the resistances of the resistors 27 and 12 are made equal, the maximum value of $gmR$ in equation (6) becomes nearly one and the $gmR$ is controlled by the control voltage $V_c$ until it falls approximately to zero. According to equation (6), when the gm R varies from zero to one, the $R_{in}$ would vary correspondingly from infinitive to $R_o$. The experimental results of FIG. 6 coincide with this presumption.

In this manner, the circuit of FIG. 5 permits the equivalent resistance to vary to a great extent under the application of the control voltage of about ± 100 millivolts.

Figure 7:
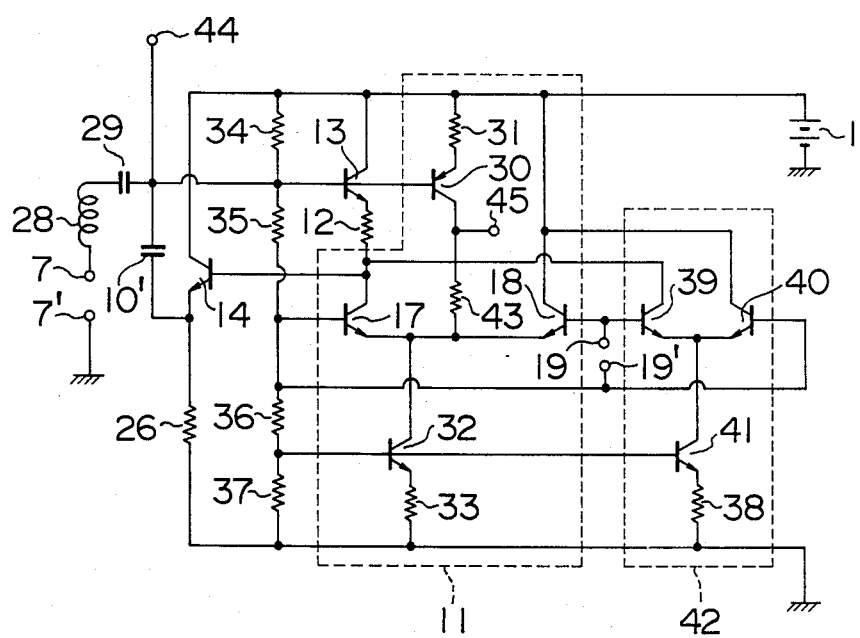
FIG. 7 is a circuit diagram of another embodiment of this invention exemplified in terms of a tuning circuit.

Turning to FIG. 7, another embodiment of the invention will be described which is applied to a tuning circuit of radio receiver sets. The same elements as those of FIG. 5 are designated at the same reference numerals. A voltage applied between the terminals 7 and 7' is a voltage induced in an antenna coil 28 of, for example, inductance L. This voltage is transmitted to bases of the NPN transistor 13 and a PNP transistor 30 through a coupling capacitor 29. An amplifier comprised by the transistor 30 and a resistor 31 corresponds to the combination of the transistor 16 and the resistor 27 in FIG. 5. A transistor 32 and a resistor 33 constitute a constant current source for providing a D.C. bias, which acts to absorb D.C. currents from the transistors 30, 17 and 18. Since the collector current of the transistor 32 is constant, variations in the collector current of the transistor 30 cause corresponding variations in the collector currents of the transistors 17 and 18. Namely, the varied corrector current of the transistor 30 is shunted to the collector currents of the transistors 17 and 18. The shunting ratio is controlled by a control voltage $V_c$ applied between the terminals 19 and 19'. Resistors 34 to 37 are D.C. bias resistors. A capacitor 10' corresponds to the impedance element 10 shown in FIGS. 4 and 5. The impedance of the capacitor 10' is controlled in accordance with equation (2) and an equivalent capacitance Ceq thereof is given by $$Ceq = CG \tag{7}$$

where C is the capacitance of the impedance element 10' and 1 + G is a total gain ranging from the base of the transistor 30 to the emitter of the transistor 14. Therefore, resonance frequency fo determinable by the equivalent capacitance Ceq and the inductance L is given by the following equation (8), $$fo = \frac{1}{2\pi \sqrt{LCeq}} \tag{8}$$

$$= \frac{1}{2\pi \sqrt{LCG}}$$

Accordingly, the gain G can be controlled by the control voltage $V_c$ so that a voltage controlled variable tuning circuit in which the resonance frequency fo is varied by the control voltage $V_c$ may be obtained.

A differential amplifier 42 comprised by a resistor 38 and transistors 39 to 41 compensates for the collector DC currents of the transistors 17 and 18 which are variable in response to the control voltage $V_c$, thereby to maintain the collector DC voltage constant. In other words, since a difference D.C. current between the D.C. currents of the transistors 30 and 32 flows through the transistors 17 and 18, the collector currents of the transistors 17 and 39 vary in a complemental manner if the resistance of the resistor 38 is set to such a value as causing a current equal to the difference D.C. current to flow through the transistor 41. Consequently, the collector D.C. current of the transistor 17 is kept constant irrespectively of the control voltage $V_c$. To obtain substantially the same resonance characteristic as the above, a branch connection consisting of the terminals 7 and 7', antenna coil 28 and coupling capacitor 29 is interchangable with another branch connection of the impedance element 10.

In FIG. 7, a resonance output can be derived from a terminal 44 or from a terminal 45 connected to a resistor 43 connected in series with the collector of the transistor 30.

As has been described in the foregoing, according to the invention, the impedance can be varied in accordance with equation (2) so that the variations in the impedance over a wide range can be assured even by the slight variation of the gain. Therefore, it is easy to provide the variable impedance circuit capable of accepting a large amplitude input signal with low distortion factor. Further, it is easy to produce the circuit of the invention in the form of an integrated circuit because the amplifier circuits and differential amplifier circuits for constituting the circuit according to the invention as shown in FIG. 5 and FIG. 7 are available in the form of usual transistorized circuits.

We claim:
1. A variable impedance circuit with an impedance variable in response to a control signal comprising:
an amplifier circuit for delivering an output current signal having a magnitude proportional to a voltage of an input signal irrespectively of a magnitude of a load, said amplifier circuit having mutual conductance between input and output terminals thereof controlled by said control signal;
means for adding a signal voltage developing across the load due to the output current signal of said amplifier circuit to said input signal voltage; and
an impedance element connected between an output terminal of said adder means and the input terminal of said amplifier circuit,
whereby an impedance as viewed from the input side to which said input signal is applied is controlled by said control signal.
2. A variable impedance circuit with an impedance variable in response to a control signal comprising:
a first amplifier circuit for delivering an output current signal having a magnitude proportional to a voltage of an input signal irrespectively of a magnitude of a load, said amplifier circuit having a mutal conductance between input and output terminals thereof controlled by said control signal;
a second amplifier circuit having an input terminal connected to the input terminal of said first amplifier circuit and having a low output impedance for delivering said input signal without changing its magnitude;
means for adding an output signal voltage of said first amplifier circuit to an output signal voltage of said second amplifier circuit; and
an impedance element connected between an output terminal of said adder means and the input terminal of said first amplifier circuit,
whereby an impedance as viewed from the input side to which said input signal is applied is controlled by said control signal.
3. A variable impedance circuit with an impedance variable in response to a control signal comprising:
an amplifier circuit for delivering an output current signal having a magnitude proportional to a voltage of an input signal irrespectively of a magnitude of a load, said amplifier circuit having a mutual conductance between input and output terminals thereof controlled by said control signal;
an impedance converter circuit having an input terminal connected to the input terminal of said amplifier circuit and having a low output impedance for delivering said input signal without changing its magnitude;
a resistor connected between the output terminal of said amplifier circuit and an output terminal of said impedance converter circuit; and
an impedance element connected between the input and output terminals of said amplifier circuit,
whereby an impedance as viewed from the input terminal of said amplifier circuit is controlled by said control signal.
4. A variable impedance circuit according to claim 3, wherein said impedance element comprises a resistor, and a resistance as viewed from the input terminal of said amplifier circuit is controlled by said control signal.
5. A variable impedance circuit with an impedance variable in response to a control signal comprising:

an amplifier circuit for delivering an output current signal having a magnitude proportional to a voltage of an input signal irrespectively of a magnitude of a load, said amplifier circuit having a mutual conductance between input and output terminals thereof controlled by said control signal;

a first emitter-follower circuit with an input terminal connected to the input terminal of said amplifier circuit;

a resistor connected between the output terminal of said amplifier circuit and an output terminal of said first emitter-follower circuit;

a second emitter-follower circuit with an input terminal connected to the output terminal of said amplifier circuit; and an impedance element connected between the input terminal of said amplifier circuit and an output terminal of said second emitter-follower circuit, whereby an impedance as viewed from the input terminal of said amplifier circuit is controlled by said control signal.

6. A variable impedance circuit according to claim 5, wherein said amplifier circuit comprises:

a pair of transistors with their emitters connected in common to constitute a differential amplifier;

a pair of terminals connected to bases of said pair of transistors respectively for applying said control signal between said bases;

means for deriving an output signal from one of collectors of said pair of transistors;

a transistor having a collector connected to the emitter of said pair of transistors; and a terminal connected to the base of said last-mentioned transistor for applying thereto said input signal.

7. A variable impedance circuit according to claim 5, wherein said impedance element comprises a resistor, and a resistance as viewed from the input terminal of said amplifier circuit is controlled by said control signal.

8. A tuning circuit suitable for a tuner of a radio receiver set having a resonance frequency variable in response to a control signal comprising:

an amplifier circuit for delivering an output current signal having a magnitude proportional to a voltage of an input signal irrespectively of a magnitude of a load, said amplifier circuit having a mutual conductance between input and output terminals thereof controlled by said control signal;

means for adding a signal voltage developing across the load due to the output current signal of said amplifier circuit to said input signal voltage;

a first impedance element connected between an output terminal of said adder means and the input terminal of said amplifier circuit; and a second impedance element connected to the input terminal of said amplifier circuit for constituting a resonance circuit in combination with an impedance as viewed from said input terminal of said amplifier circuit, whereby the resonance frequency is controlled by said control signal.

9. A tuning circuit suitable for a tuner of a radio receiver set having a resonance frequency varible in response to a control signal comprising:

an amplifier circuit for delivering an output current signal having a magnitude proportional to a voltage of an input signal irrespectively of a magnitude of a load, said amplifier circuit having a mutual conductance between input and output terminals thereof controlled by said control signal;

an impedance converter circuit having an input terminal connected to the input terminal of said amplifier circuit and having a low output impedance for delivering said input signal without changing its magnitude;

a resistor connected between the output terminal of said amplifier circuit and an output terminal of said impedance converter circuit;

a first impedance element connected between the input and output terminals of said amplifier circuit; and a second impedance element connected to the input terminal of said amplifier circuit for constituting a resonance circuit in combination with an impedance as viewed from said input terminal of said amplifier circuit, whereby the resonance frequency is controlled by said control signal.

10. A tuning circuit suitable for a tuner of a radio receiver set having a resonance frequency variable in response to a control signal comprising:

an amplifier circuit for delivering an output current signal having a magnitude proportional to a voltage of an input signal irrespectively of a magnitude of a load, said amplifier circuit having a mutual conductance between input and output terminals thereof controlled by said control signal;

a first emitter-follower circuit with an input terminal connected to the input terminal of said amplifier circuit;

a resistor connected between the output terminal of said amplifier circuit and an output terminal of said first emitter-follower circuit;

a second emitter-follower circuit with an input terminal connected to the output terminal of said amplifier circuit;

a first impedance element connected between the input terminal of said amplifier circuit and an output terminal of said second emitter-follower circuit; and a second impedance element connected to the input terminal of said amplifier circuit for constituting a resonance circuit in combination with an impedance as viewed from said input terminal of said amplifier circuit, whereby the resonance frequency is controlled by said control signal.

* * * * *